(12) United States Patent
Tiren et al.

(10) Patent No.: US 6,522,203 B1
(45) Date of Patent: Feb. 18, 2003

(54) POWER AMPLIFYING TRANSISTORS

(75) Inventors: Jonas Tiren, Uppsala (SE); Jesper Engvall, Sundbyberg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/671,831

(22) Filed: Sep. 27, 2000

(30) Foreign Application Priority Data

Sep. 28, 1999 (SE) ................................................ 9903497

(51) Int. Cl.$^7$ ............................... H03F 3/68; H03F 3/16
(52) U.S. Cl. ........................ 330/295; 330/126; 330/307
(58) Field of Search ............................ 330/124 R, 126, 330/277, 295, 307

(56) References Cited

U.S. PATENT DOCUMENTS

| | | | |
|---|---|---|---|
| 4,276,516 A | 6/1981 | Congdon | 330/272 |
| 4,682,197 A | 7/1987 | Villa et al. | 357/36 |
| 6,242,985 B1 * | 6/2001 | Shinomiya | 330/295 |

* cited by examiner

*Primary Examiner*—Steven J. Mottola
(74) *Attorney, Agent, or Firm*—Nixon & Vanderhye P.C.

(57) ABSTRACT

In an output stage of an electronic signal processing circuit such as that used for transmission from a mobile telephone set the amplifier circuit comprises two power transistors (A, B) or type FET. The power transistors are used for amplifying different signals such as signals for different wavelength bands in a duel band telephone set and they are not used simultaneously. Each power transistor comprises a multitude of elementary transistors (19, 21) or "fingers" which are interdigitated to form an interleaved configuration, the element transistors of one transistor alternating with the element transistors of the other transistor. Thereby the effective area which can receive heat dissipated by the element transistors will be twice that used when the element transistors are located in two geometrically separated groups which will allow a higher power load on each transistor element.

7 Claims, 6 Drawing Sheets

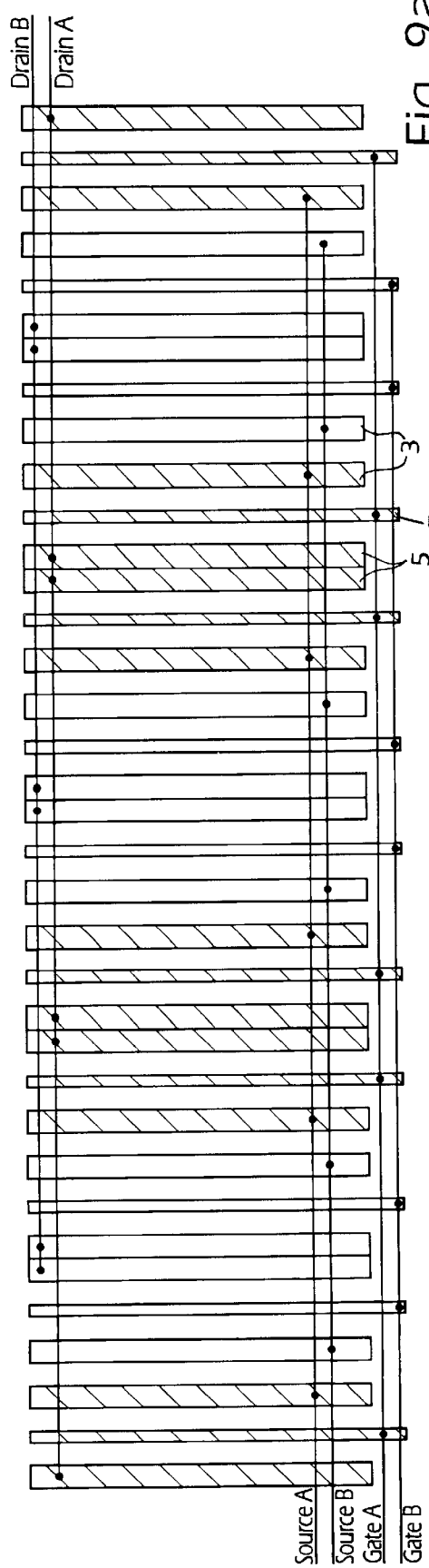
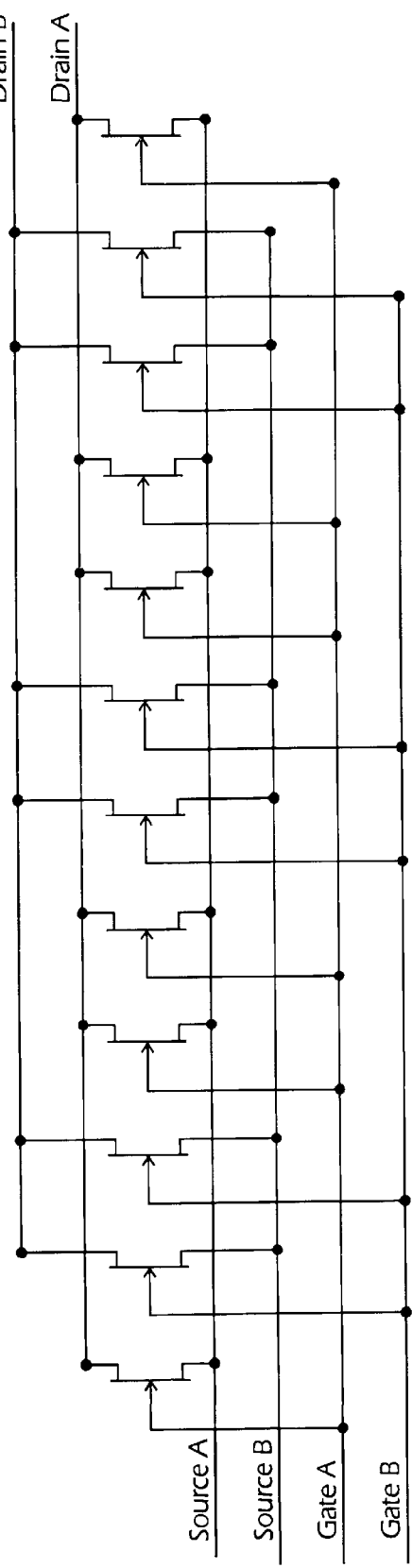
Fig. 9a
Fig. 9b

POWER AMPLIFYING TRANSISTORS

The present invention is related to an amplifier circuit suitable for amplifying at least two different signals such as signals of two different wavelength bands.

BACKGROUND

In communication with mobile stations there nowadays is a need for using different standards which can require modulation methods suited for the respective amplification methods and hence different amplifier designs can be required. Also different wavelength bands are used in the different standards. In a dual band mobile station the station can receive and transmit signals in two different wavelength bands, e.g. using GSM at wavelengths at 1800 MHz and AMPS at 800 MHz.

In a mobile station such as a mobile telephone set a power amplifier is used in the final step of transmitting signals from the station. In the power amplifier power transistors are used for amplifying the signals. These transistors usually comprise FETs (Field Effect Transistors) of various designs. The output power required for different standards may be different for the respective wavelength bands and thus the output FETs must be driven to produce an output power which is different for each band. For instance, for 900 MHz an output power of 3.5 W can be required and for 1800 MHz the required output power can be 1.6 W. There exists a multitude of standards using different wavelength band such as AMPS for 800 MHz as mentioned above, GSM for 900 and 1800 MHz and PCS for 1900 MHz. Also, the output transistors may have to be designed differently for different standards owing to the use of different modulation methods which require specially selected operating points, etc.

FETs used as output amplifiers can only be designed to optimally produce an output power for a particular small range of the output power. In FIG. 1 a diagram of the efficiency $\eta$ of a FET is plotted as a function of the output power for some special assumptions which can e.g. include constant drain-source voltage, constant load resistance, only the average gate-source being varied, etc. In the diagram FIG. 1 two graphs are plotted, one for the efficiency of FET optimized for the output power for transmitting at 900 MHz according to some standard and another one for transmitting at 1800 MHz according to some similar standard, which however requires a lower output power. The respective transistors can only be used in the regions lower than the respective shaded area. Suitable operating points are indicated by the dashed lines. It is observed in the figure that a FET designed to optimally work to provide the power required at 900 MHz will have a lower efficiency when used for providing a lower output power at a higher frequency such as 1800 MHz under these assumptions. Generally, thus it is concluded that it is difficult to design an optimized single output FET for a multimode power amplifier. In the example of FIG. 1 different FETs should used which are designed to optimally provide the required output power at the two frequencies. The two FETs could then e.g. each have as small an area as possible to be suited to provide the respective output power.

However, also the power consumption and the cooling of the FETs must be considered. There is generally an increasing demand for transmitting data from the mobile stations using standard networks. In such networks the time for communicating with a considered base station is divided in time slots so that transmission from a considered mobile station can be made say at most every eighth time slot. This means that if a FET is designed for a particular output power, the power consumption and the power dissipation will only correspond to about an eighth of the amounts required for a continuous transmission. When data transmission is required, more time slots can be assigned to the mobile station, e.g. two or three time slots out of a set of totally eight time slots. This in turn implies that the power amplifiers and the FETs comprised therein must be designed for this higher average output power and thus the cooling of the power circuits has to be improved. This would generally require that the area of the FETs had to be considerably increased in order to enhance the conduction of heat away from the transistors.

In U.S. Pat Nos. 4,276,516 and 4,682,197 interdigitated bipolar transistor structures for power amplifiers of Class B are disclosed in which neighbouring fingers comprise the complementary transistors which conventionally are alternatingly switched on in such amplifiers.

SUMMARY

It is an object of the invention to provide an amplifier circuit for two different wavelength bands which has an efficient cooling and an efficient use of chip area.

The problem to be solved by the invention is thus how to integrate the different transistors needed for amplifying signals of two wavelength bands in order to occupy a small area on a semiconductor chip and to have transistors located so that the power dissipated by the transistors can efficiently be conducted away.

In a structure of power field effect transistors and for instance used in an output stage of signal processing circuit each individual transistor comprises a multitude of "fingers", the fingers being element or elementary transistors located to form a line or row. By interdigitating the fingers so that element transistors belonging to one power transistor alternate with transistors belonging to another power transistor each element transistor will have a large surface area of a chip which will receive the heat developed by the element transistor. This presupposes that at each instant only one power transistor is active which is true for instance when communicating using different wavelength bands and each wavelength band has its own power transistor.

The element transistors are thus collected in groups to form field effect transistor units which are used for different purposes. One transistor unit can thus be intended for amplifying signals of wavelengths or of wavelength band requiring more electric output power such as a lower frequency band. Since this transistor unit has to supply an output signal having a large output power, it hence requires a large area of a chip. Another transistor unit can require a smaller area since when it is active less heat is developed, such a transistor unit for instance being intended to amplify signals of a higher frequency. The number of element transistors of a first transistor unit can thus be larger than the number of element transistors of a second transistor unit. Alternatively or combined therewith the element transistors of the second transistor unit can each one occupy a smaller area than the element transistors of the second transistor unit.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 6b is the circuit diagram equivalent with the FETs illustrated in FIG. 6a,

FIGS. 9a and 9b are views similar to FIGS. 6a and 6b respectively illustrating a layout of FETs having well separated sources.

DETAIL DESCRIPTION

Figure 1:
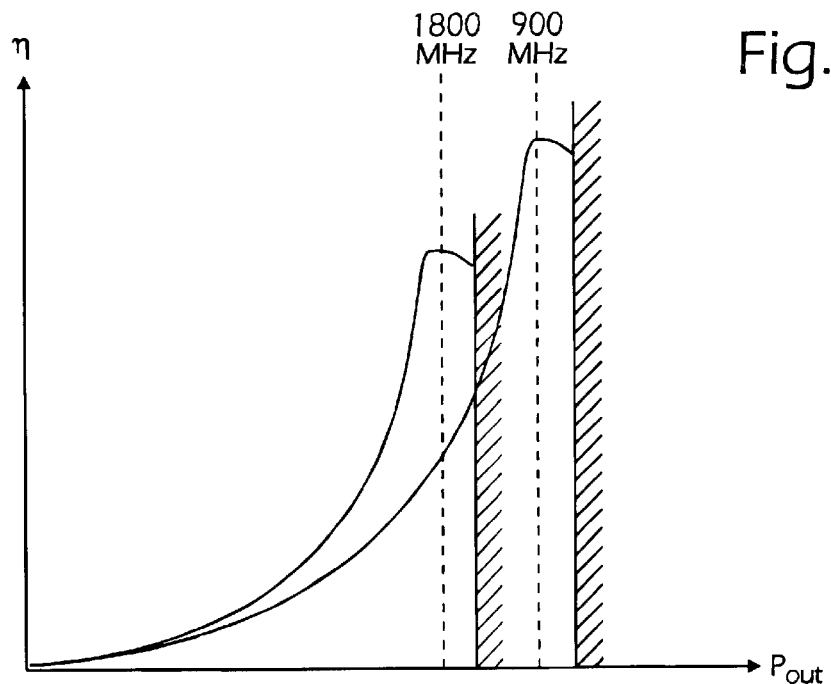
FIG. 1 is a diagram of the efficiency of a power field-effect transistor (FET) as a function of output power.
Figure 2A:
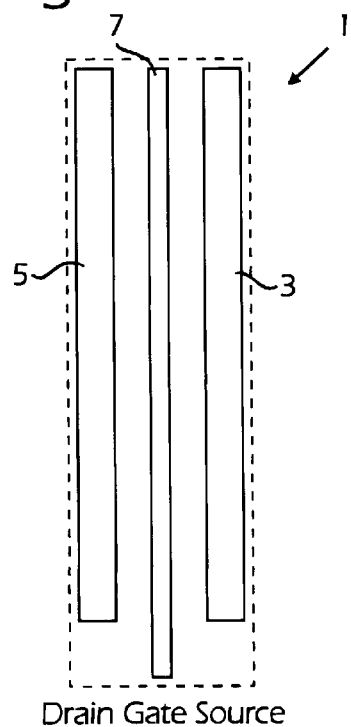
FIG. 2a is a schematic view from above of the layout of a single FET finger.
Figure 2B:
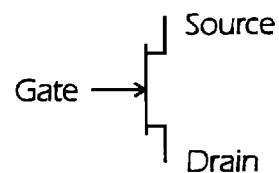
FIG. 2b is the circuit symbol of a FET.

Field-effect transistors made for power amplifiers in e.g. mobile stations are commonly made by connecting a multitude of small or elementary FETs in parallel to produce a so called multifinger structure. An element finger 1 of such a FET is schematically illustrated in FIG. 2a as seen from above. The source 3 and drain 5 are seen as elongated rectangular parallel regions having their longitudinal directions in parallel to each other and to the longitudinal direction of the gate region 7 located between the source and the drain. The gate region 7 is generally made of a metal layer on top of some electrically insulating layer. The signal is provided to the gate 7 as a voltage modulating the current between source and drain. The circuit diagram equivalent of the FET depicted in FIG. 2a is shown in FIG. 2b.

Figure 3:
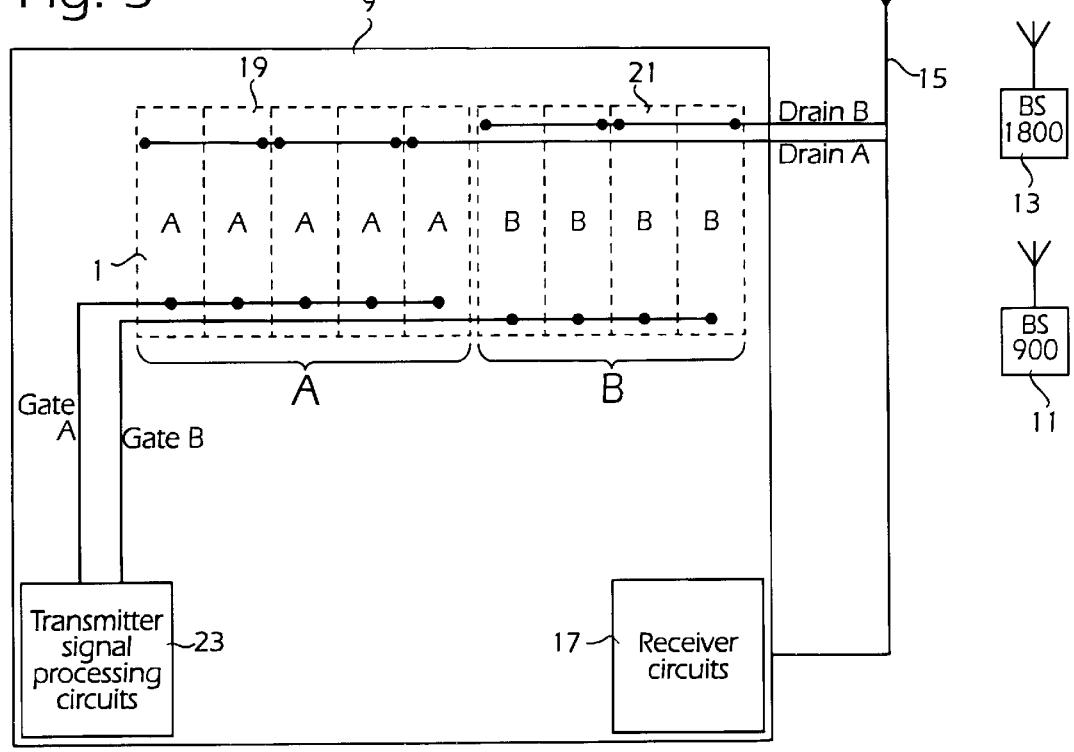
FIG. 3 is a schematic view illustrating the use of different output FETs for different communication channels in a mobile unit communication system.

A dual band mobile station 9 communicating with base stations 11, 13 is illustrated in the schematic picture of FIG. 3. The antenna 15 of the mobile station is connected to receiver circuits 17 and through power FETs 19, 21 to transmitter signal processing circuits 23. The FETs are arranged in two groups A, B comprising the FET elements 19, 21, each FET element occupying an elongated rectangular area on a chip and each area being an elementary finger 1 as depicted in FIG. 2a. The FETs 19 of the first group A are intended to amplify signals for a lower wavelength and thus must be capable of providing a high output power an hence occupy a larger tool area than the FETs 21 of the second group B intended for a higher wavelength band. This means, that if the elementary fingers of the two group of FETs have an equal length and thus occupy an equal area, the first FET needs more fingers than the second one. The first group A of FETs 19 thus comprises five fingers, the gates of the fingers being connected in parallel to one output terminal of the transmitter signal processing circuits 23, whereas the second group B of FETs 21 comprises a smaller number, in this case four fingers, the gates of the fingers being connected in parallel to another output terminal of the transmitter circuits 23. The total area of the FETs 19 of the first group A is physically or geometrically separated from the total area occupied by the FETs 21 of the second group. The layout of the fingers is shown in detail in the schematic view of FIG. 5a. In this figure it is seen that the antenna 15 is connected to the drains 5 of the elementary FETs of each group A, B and that the sources of the FETs of each group are connected in parallel, for instance to a common ground.

Figure 4:
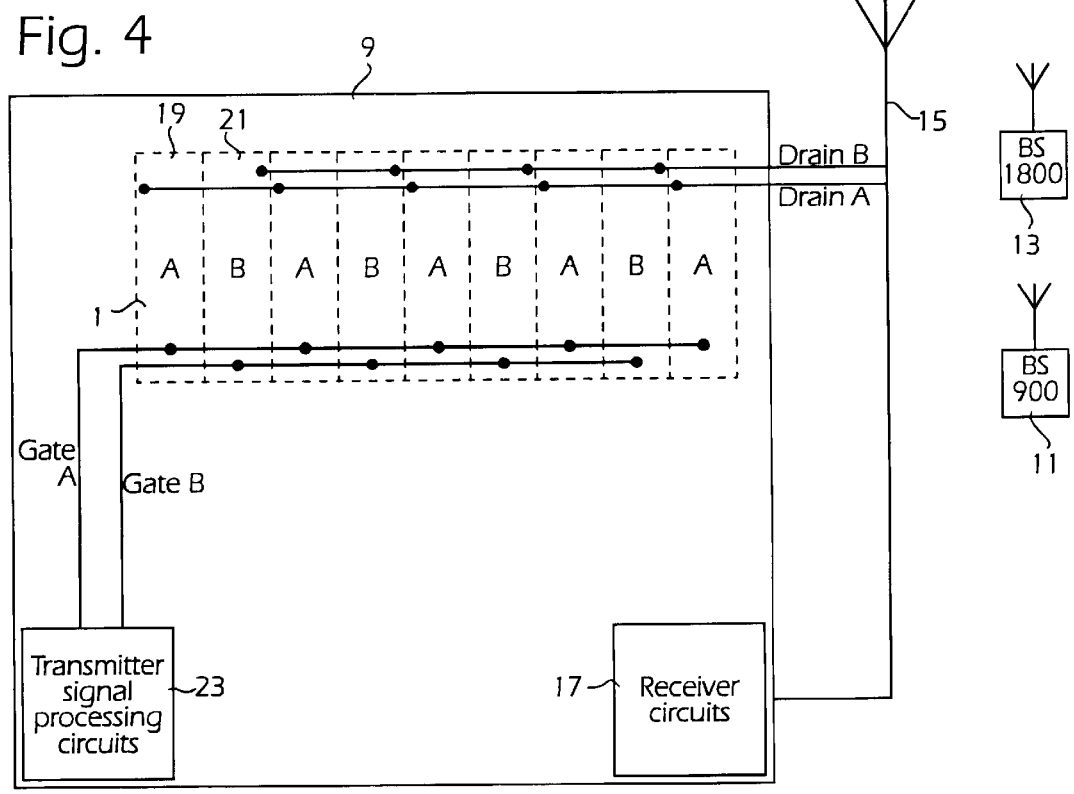
FIG 4. is a schematic view similar to that of FIG. 3 illustrating interdigitated elementary FETs.
Figure 5A:
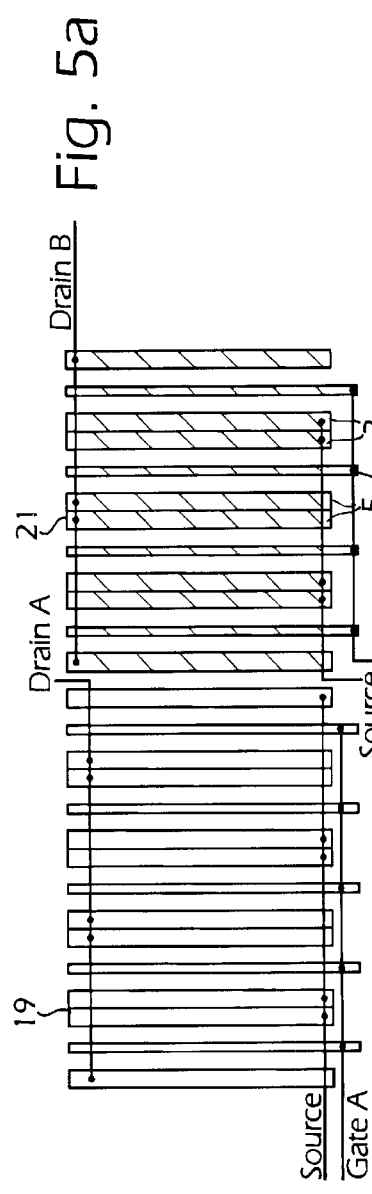
FIG. 5a is a schematic view similar to that of FIG. 2a illustrating the layout of the FETs in the embodiment of FIG. 3 and the juxtaposition of FET fingers having sources and drains in common.
Figure 5B:
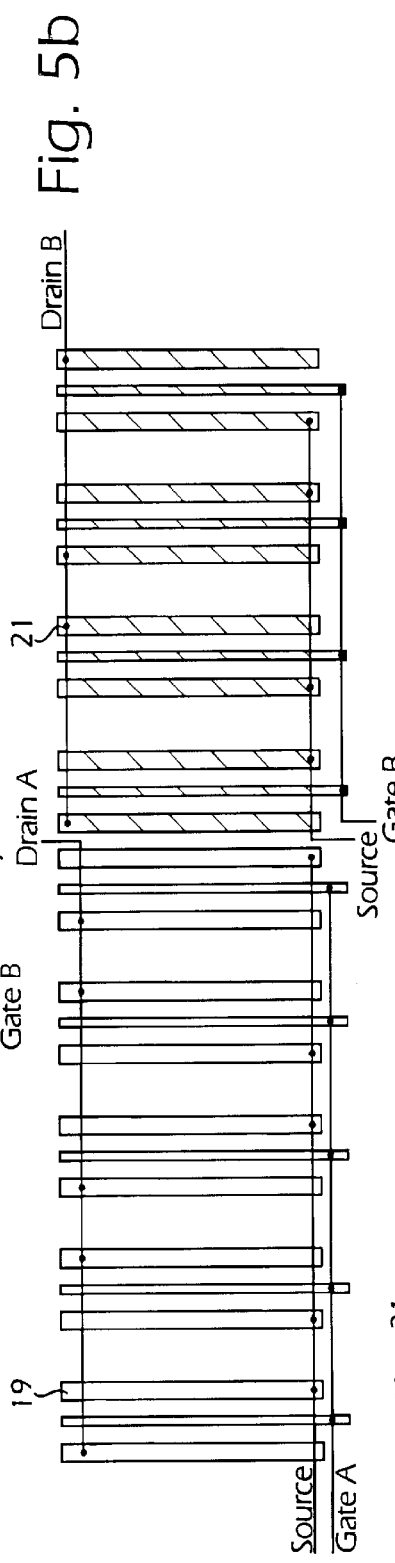
FIG. 5b is a schematic view similar to that of FIG. 5a illustrating a layout of the FETs allowing a heavier load.
Figure 5C:
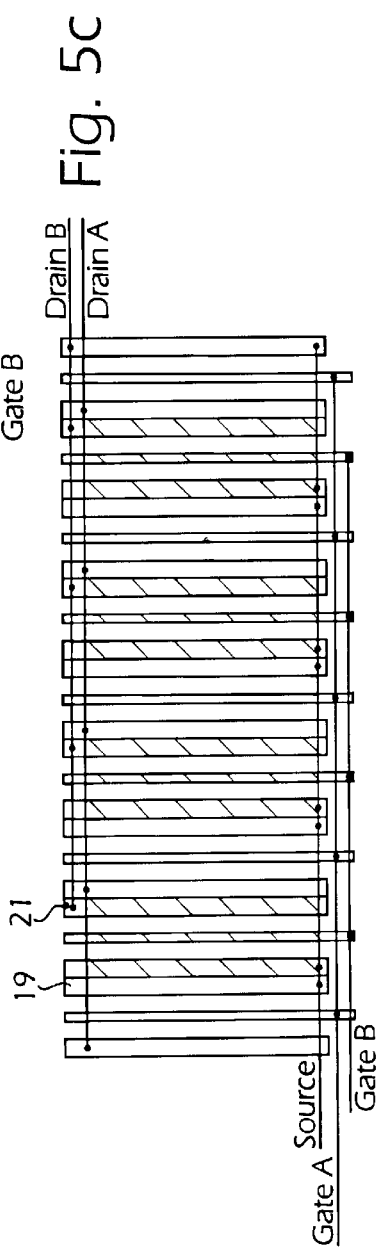
FIG. 5c is a schematic view similar to that of FIG. 5a illustrating a layout of FETs allowing a heavier load and requiring a minimum of space.

However, when the elementary FETs 19, 21 have to carry more load, such as when using more time slots in a time division multiplex system, each FET element will be more intensely heated and they must each be given more space on the chips, as is illustrated in FIG. 5b. The additional space requirement can be up to 50–100% of the space used in the layout illustrated in FIG. 5a. Since the transmission from the mobile station 9 always is on a single wavelength band, i.e. either on e.g. 900 MHz or 1900 MHz, and hence the FETs of each group are not simultaneously operated or energized, they can be interleaved so that most of the elementary FETs in an active group are separated by at least one elementary FET of the non-active group. Thereby the generated heat is distributed over a larger area and can be conducted away. Then most of the elementary FETs will have an effective space on the chip equal to twice the area of the element FET. Such a layout is illustrated in detail FIG. 5c and also appears from FIG. 4. Here each element FET of one group is located between element FETs of the other group, not considering the outermost FETs. The rectangular area of each elementary finger are thus interleaved or interdigitated to form a structure or pattern of rectangular regions placed with their long sides parallel to and at each other with a uniform spacing.

In the layout of the fingers as illustrated in FIG. 5a the drain of one finger is located directly at the side of the drain of the adjacent finger, so that the FET fingers are mirrored, i.e. every second finger of each group is identical, i.e. the 1st, 3rd and 5th fingers are identical to each other and the 2nd and 4th fingers are identical to each other in each group. In the embodiment the same configuration of having drains or sources in neighbouring transistors located directly at the side of each other is used. Every second finger is here identical, i.e. the 1st, 3rd, 5th, 7th, 9th fingers are identical to each other and constitutes the first group A of FETs and the 2nd, 4th, 8th, 10th fingers are identical to each other and constitutes the second group B of FETs.

Figure 6A:
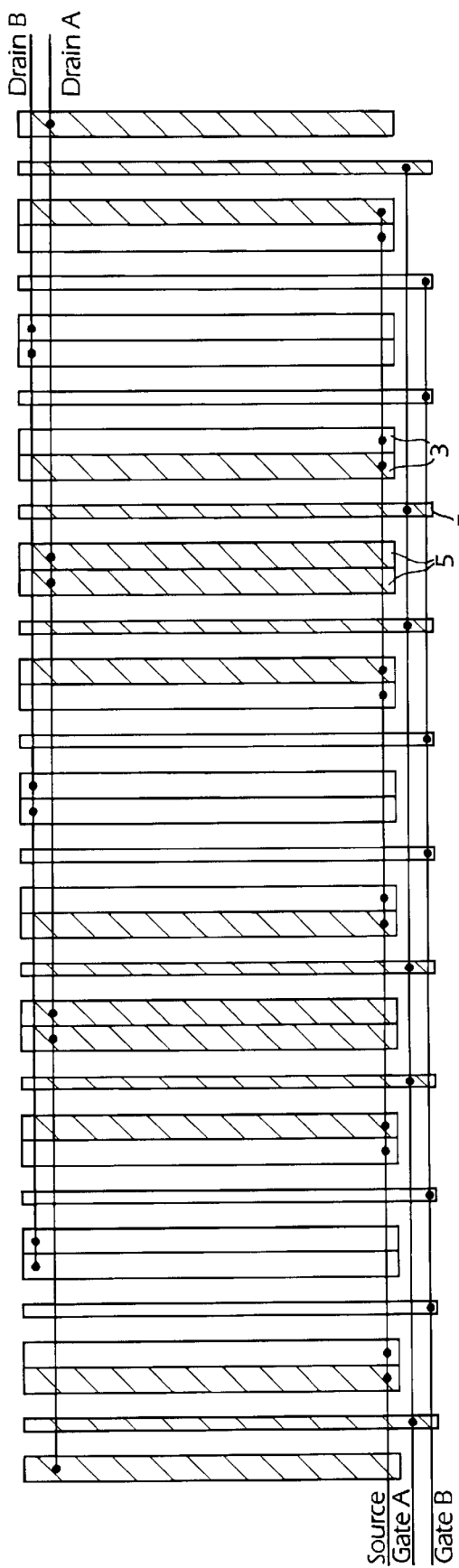
FIG. 6a is a schematic view similar to that of FIG. 5a illustrating an alternative layout of FETs allowing a heavier load and requiring a minimum of space.
Figure 6B:
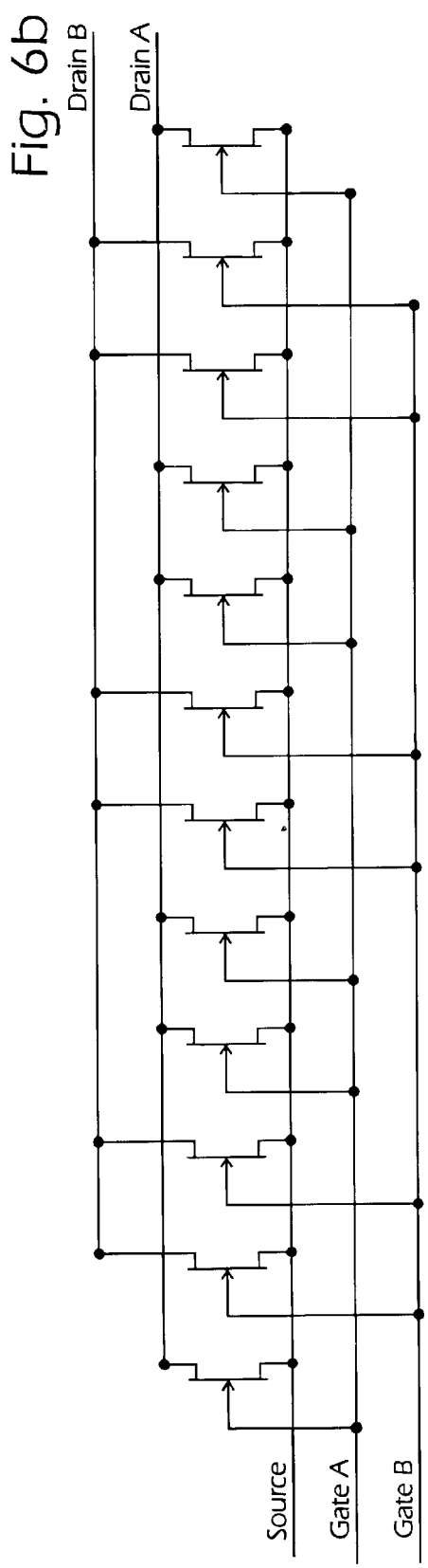

In some cases it may be advantageous to locate the FETs of each group in pairs. Such a layout is illustrated in FIG. 6a. The outermost FETs thus belong to group A, the next two inner FETs belong to group B, the next two inner FETS to group A, etc. The circuit equivalent of the layout of FIG. 6a is shown in FIG. 6b.

Figure 7:
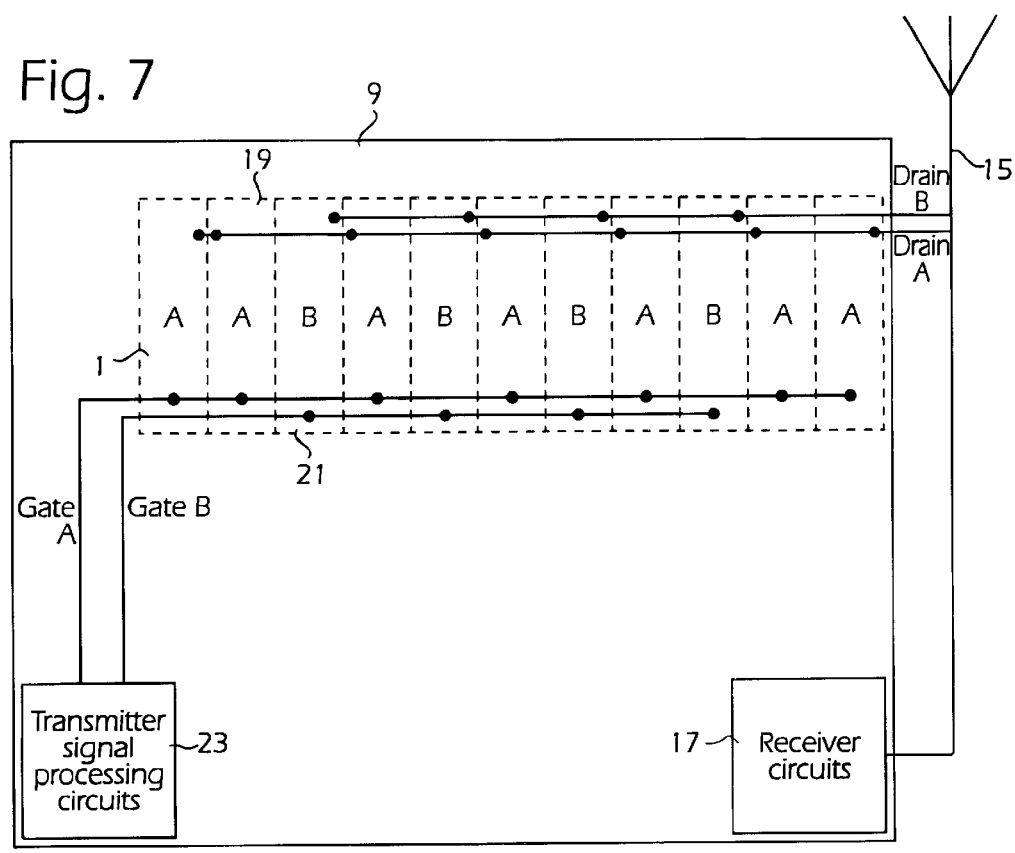
FIG. 7 is a view similar to that of FIG. 3 of another structure of interdigitated FETs allowing a heavy load and requiring little space.

Since the cooling of the chip can be better at the ends of the row or line of elementary FETs 19, 21, there can be more FETs of the group requiring a higher power at the ends. Such a structure is illustrated in FIG. 7. In the middle of the structure, as seen in a transverse direction, perpendicular to the long sides of the elementary regions 1, every second FET finger belongs to the first group A of FETs and every other second FET finger belongs to the second group B of FETs. More elementary FETs of the first group A, here a pair of FETs 19, are distributed at the ends of the structure as seen in the same direction, since, as has already been observer, at the ends the heat is more easily conducted away from the area.

Figure 8:
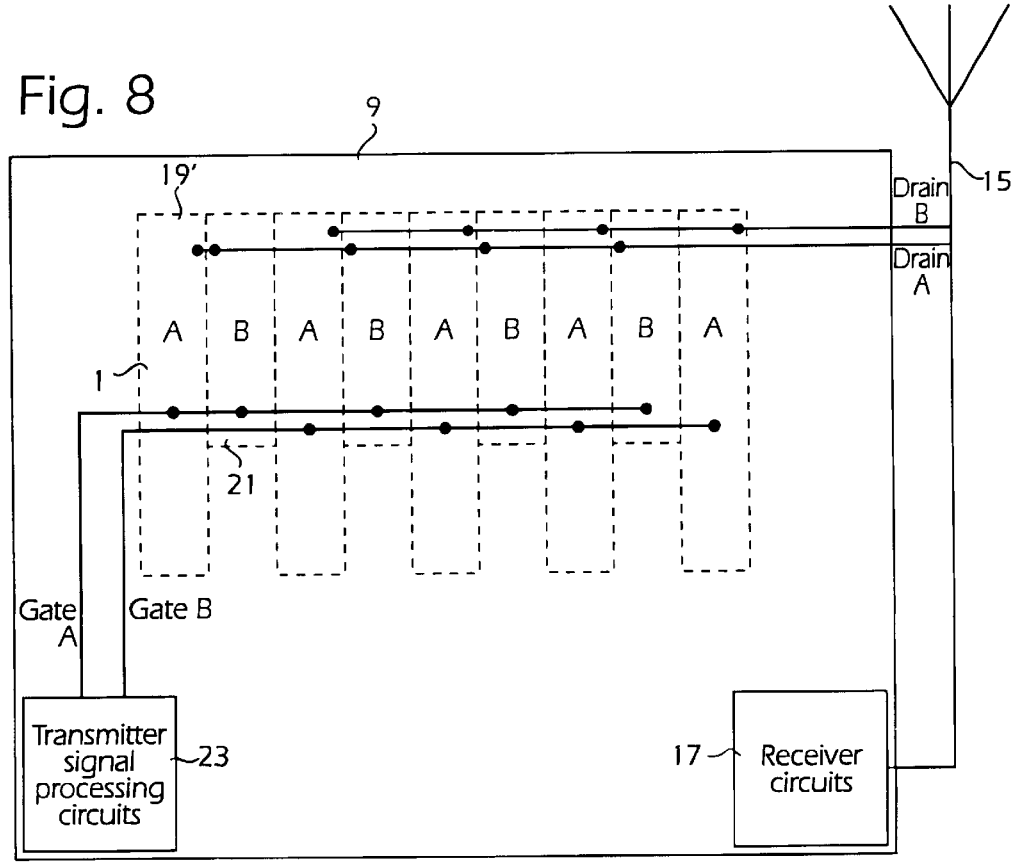
FIG. 8 is a view similar to that of FIG. 3 of still another structure of interdigitated FETs allowing a heavy load and requiring little space.

Another embodiment is illustrated in FIG. 8. Here the fingers 19' of the first group A of FETs strictly alternates with fingers 21 of the second group B as in the embodiment of FIG. 4. In order to give the FETs of the first group a larger total area, the fingers 19' of this group are given a larger length than those of the second group of FETs 21. This embodiment apparently uses the area of the chip in a somewhat less efficient way than the embodiment of FIGS. 5c, 6 and 7.

In some cases the sources of the different transistors cannot be placed directly at each other since such a location would cause a risk of cross-talk phenomena between the active and non-active transistor what could cause that also the non-active transistor would provide some output signal. Then the sources of the elementary transistors of the field effect transistors have to separated by a strip or gap having a suitable width, as is illustrated in FIG. 9a. The field effect transistors will then be completely electrically separated and the total area occupied by the field effect transistors will somewhat increased. The corresponding circuit diagram is shown in FIG. 9b.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. An amplifier circuit for amplifying signals, the amplifier circuit comprising:

at least two power field effect transistors, a first power field effect transistor and a second power field effect transistor different from the first power field effect transistor, the first power field effect transistor arranged to amplify first signals and the second power field effect transistor being arranged to amplify second signals, each power field effect transistor comprising a multitude of elementary transistors, the power field effect transistors and the elementary transistors having source, gate and drain electrodes, wherein the elementary transistors of the first power field effect transistor are located alternatingly with the elementary transistors of the second power field effect transistor, and each elementary transistor comprised in the first power field effect transistor and located between two elementary transistors comprised in the second power field effect transistor has its source located directly at the source of the elementary transistor comprised in the second power field effect transistor and located at one side of the elementary transistor comprised in the first power field effect transistor and has its drain located at the drain of another elementary transistor comprised in the second power field effect transistor and located at a different side of the elementary transistor comprised in the first power field effect transistor.

2. The amplifier circuit of claim 1 arranged to amplify first and second signals, one of which is only present at each instant, so that when the first power field effect transistor is active the second power field transistor is inactive and vice versa, whereby elementary transistors of an active one of the power field effect transistors are separated by spaces in which elementary transistors of an inactive power field effect transistor are located.

3. The amplifier circuit of claim 1 arranged to amplify signals of at least two wavelength bands, the first signals being comprised in a wavelength band separate from a wavelength band, in which the second signals are comprised.

4. The amplifier circuit of claim 1 comprising a circuit plate, the elementary transistors occupying rectangular areas at the surface of a circuit plate, the rectangular areas have long opposite sides and short opposite sides, a long side of the rectangular area an elementary transistor located at a long side the rectangular area of another elementary transistor.

5. The amplifier circuit of claim 4, wherein the rectangular areas of the elementary transistors of at least one of the first and second power field effect transistors are all identical to each other.

6. The amplifier circuit of claim 4, wherein the rectangular areas of the elementary transistors of the first and second power field effect transistor are all identical to each other.

7. The amplifier circuit of claim 4, characterized in that the rectangular areas of the elementary transistors of the first power field effect transistor are larger than the rectangular areas of the elementary transistors of the second power field effect transistor.

* * * * *